(12) United States Patent
Wang

(10) Patent No.: US 12,727,138 B2
(45) Date of Patent: Sep. 1, 2026

(54) SEMICONDUCTOR STRUCTURE AND FORMING METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Nan Wang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 917 days.

(21) Appl. No.: 17/952,956

(22) Filed: Sep. 26, 2022

(65) Prior Publication Data

US 2023/0098671 A1 Mar. 30, 2023

(30) Foreign Application Priority Data

Sep. 29, 2021 (CN) .......................... 202111152737.1

(51) Int. Cl.
*H10B 10/00* (2023.01)
*H10D 30/01* (2025.01)
(Continued)

(52) U.S. Cl.
CPC ........... *H10B 10/12* (2023.02); *H10D 30/024* (2025.01); *H10D 30/6211* (2025.01);
(Continued)

(58) Field of Classification Search
CPC ... H10B 10/12; H01L 23/481; H01L 23/5283; H01L 21/76895; H01L 23/485;
(Continued)

(56) References Cited

U.S. PATENT DOCUMENTS 11,121,078 B2 * 9/2021 Chen ........................ G11C 7/02
2020/0098681 A1 * 3/2020 Kim .................... H01L 23/5286
2021/0375722 A1 * 12/2021 Kim .................... H10W 20/023

FOREIGN PATENT DOCUMENTS

CN 1536674 A 10/2004
CN 111106059 A 5/2020

* cited by examiner

*Primary Examiner* — Britt Hanley
*Assistant Examiner* — William C. Trice, III
(74) *Attorney, Agent, or Firm* — Anova Law Group, PLLC

(57) ABSTRACT

Semiconductor structure and forming method thereof are provided. The forming method includes: forming a substrate including a power rail region, the power rail region including a first area and a second area, the power rail region having a first fin and a second fin spanning the second area; forming sidewall spacers on sidewall surfaces of the first fin and the second fin after forming the first fin and the second fin; forming a first patterned layer on the substrate, the first patterned layer having a first opening in the first patterned layer exposing the power rail region; etching the substrate using the first patterned layer as a mask to form power rail openings in the substrate; forming isolation films on inner wall surfaces of the power rail openings; and forming buried power rails in the power rail openings after forming the isolation films.

19 Claims, 8 Drawing Sheets

(51) Int. Cl.
*H10D 30/62* (2025.01)
*H10D 64/01* (2025.01)
*H10D 84/01* (2026.01)
*H10D 84/03* (2025.01)
*H10W 20/20* (2026.01)

(52) U.S. Cl.
CPC ......... *H10D 64/021* (2025.01); *H10D 84/013* (2025.01); *H10D 84/0147* (2025.01); *H10D 84/0149* (2025.01); *H10D 84/038* (2025.01); *H10W 20/20* (2026.01)

(58) Field of Classification Search
CPC . H01L 23/5286; H01L 23/535; H01L 21/743; H10D 30/024; H10D 30/6211; H10D 64/021; H10D 84/013; H10D 84/0147; H10D 84/0149; H10D 84/038; H10D 84/834; H10D 84/0158; H10D 89/10
See application file for complete search history.

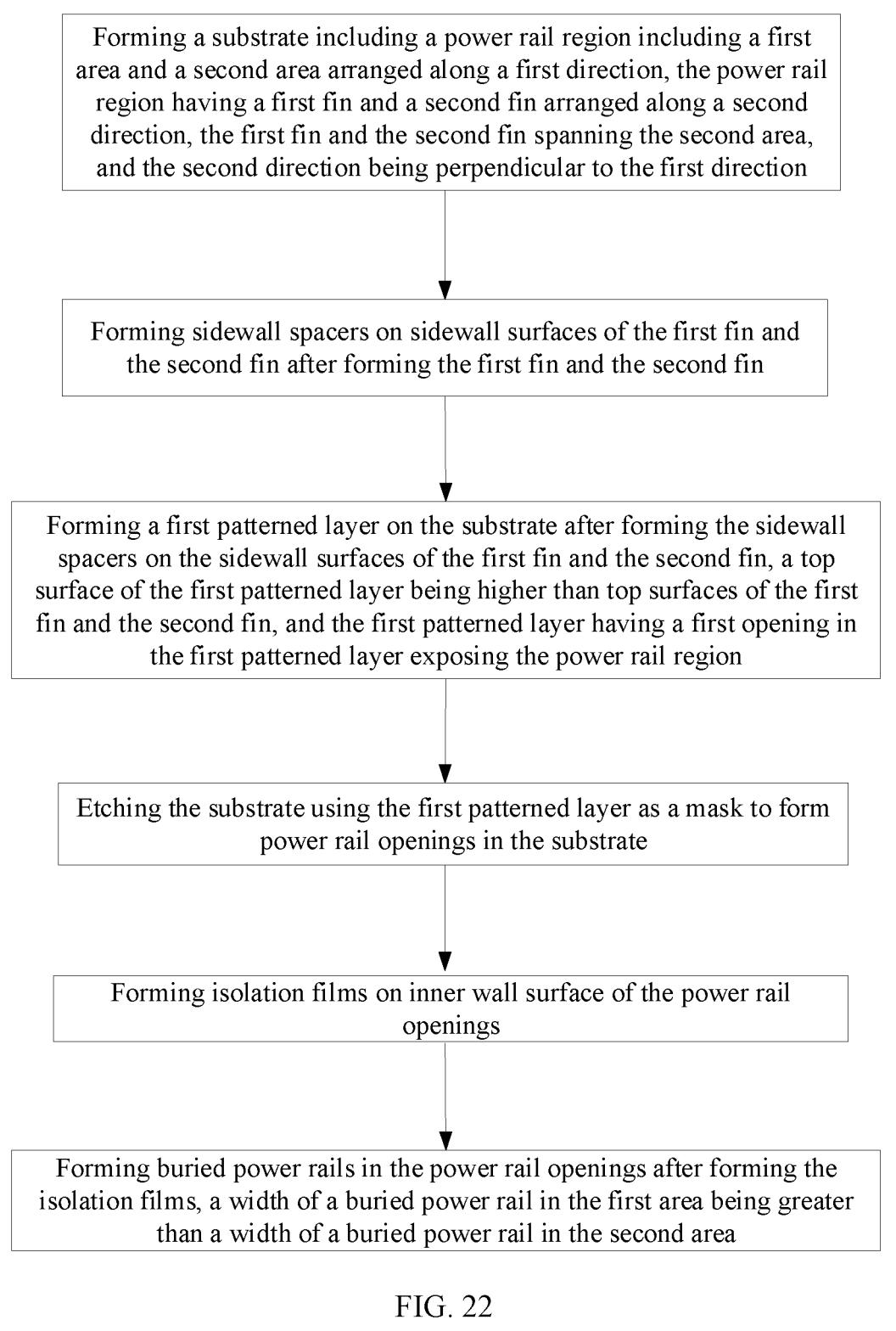

Forming a substrate including a power rail region including a first area and a second area arranged along a first direction, the power rail region having a first fin and a second fin arranged along a second direction, the first fin and the second fin spanning the second area, and the second direction being perpendicular to the first direction Forming sidewall spacers on sidewall surfaces of the first fin and the second fin after forming the first fin and the second fin Forming a first patterned layer on the substrate after forming the sidewall spacers on the sidewall surfaces of the first fin and the second fin, a top surface of the first patterned layer being higher than top surfaces of the first fin and the second fin, and the first patterned layer having a first opening in the first patterned layer exposing the power rail region Etching the substrate using the first patterned layer as a mask to form power rail openings in the substrate Forming isolation films on inner wall surface of the power rail openings Forming buried power rails in the power rail openings after forming the isolation films, a width of a buried power rail in the first area being greater than a width of a buried power rail in the second area

FIG. 22

SEMICONDUCTOR STRUCTURE AND FORMING METHOD THEREOF

CROSS-REFERENCE TO RELATED APPLICATIONS

This application claims priority of Chinese Patent Application No. 202111152737.1, filed on Sep. 29, 2021, the entire contents of which are hereby incorporated by reference.

FIELD OF THE DISCLOSURE

The present disclosure generally relates to the field of semiconductor manufacturing and, more particularly, relates to a semiconductor structure and a forming method thereof.

BACKGROUND

In current semiconductor industry, integrated circuit products can be mainly divided into three types: logic, memory and analog circuits, among which memory devices account for a considerable proportion of the integrated circuit products.

With a development of the storage technology, various types of semiconductor memories have been developed, such as static random access memory (SRAM), dynamic random access memory (DRAM), erasable programmable read-only memory (EPROM), flash memory (Flash), and the like.

Because the SRAM memory has advantages of low power consumption and relatively fast working speed, the SRAM memory and its forming method have received more and more attention.

However, in the existing technologies, process window for forming the SRAM memory is small, and performance of the SRAM memory needs to be improved.

BRIEF SUMMARY OF THE DISCLOSURE

One aspect of the present disclosure provides a semiconductor structure. The semiconductor structure includes: a substrate including a power rail region, the power rail region including a first area, a second area and a third area arranged along a first direction; a first fin on the first and second areas, and a second fin on the second and third areas, the first and second fins being arranged along a second direction, and the second direction being perpendicular to the first direction; buried power rails in the power rail region, a buried power rail in the second area being in the substrate between the first fin and the second fin, and, in a second direction, a width of a buried power rail in the second area and the third area is greater than a width of the buried power rail in the second area; and isolation films between the buried power rails and the substrate.

Another aspect of the present disclosure provides a method for forming a semiconductor structure. The method includes: forming a substrate including a power rail region, the power rail region including a first area and a second area arranged along a first direction, the power rail region having a first fin and a second fin arranged along a second direction, the first fin and the second fin spanning the second area, and the second direction being perpendicular to the first direction; forming sidewall spacers on sidewall surfaces of the first fin and the second fin after forming the first fin and the second fin; forming a first patterned layer on the substrate after forming the sidewall spacers on the sidewall surfaces of the first fin and the second fin, a top surface of the first patterned layer being higher than top surfaces of the first fin and the second fin, and the first patterned layer having a first opening in the first patterned layer exposing the power rail region; etching the substrate using the first patterned layer as a mask to form power rail openings in the substrate; forming isolation films on inner wall surfaces of the power rail openings; and forming buried power rails in the power rail openings after forming the isolation films, a width of the buried power rail on the first area being greater than a width of the buried power rail on the second area.

Other aspects or embodiments of the present disclosure can be understood by those skilled in the art in light of the description, the claims, and the drawings of the present disclosure.

BRIEF DESCRIPTION OF THE DRAWINGS

FIG. 22 illustrates an exemplary method for forming a semiconductor structure according to various disclosed embodiments of the present disclosure.

DETAILED DESCRIPTION

As described in the background, in the existing technologies, process window for forming a SRAM memory is small, and performance of the SRAM memory needs to be improved. An analysis is carried out in conjunction with a semiconductor structure.

FIGS. 1-5 illustrate structural views of semiconductor structures corresponding to certain stages during a process of forming a semiconductor structure.

Figure 1:
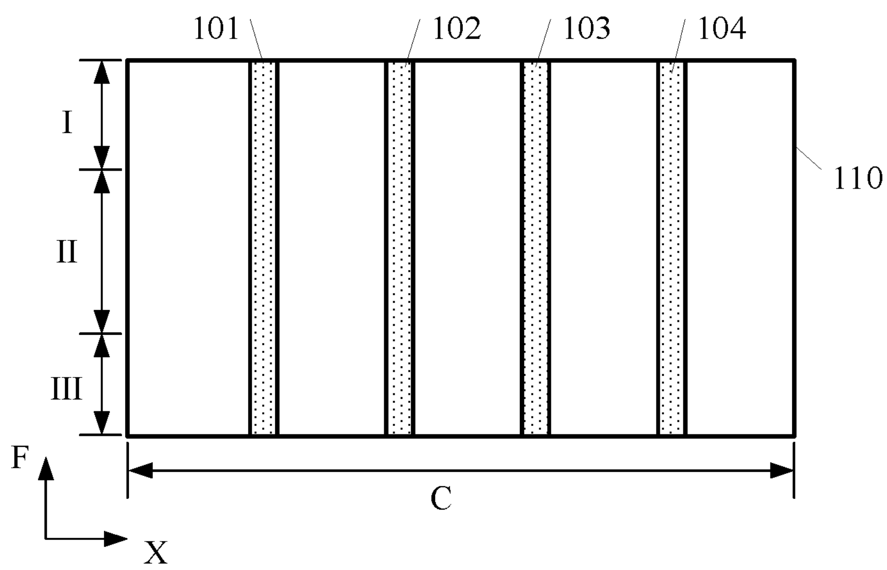
FIGS. 1-5 illustrate structural views of semiconductor structures corresponding to certain stages during a process of forming a semiconductor structure.
Figure 3:
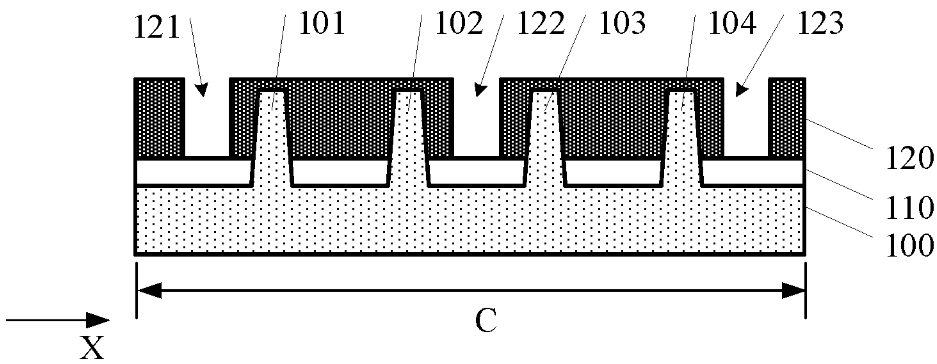

FIG. 1 illustrates a top structural view of a semiconductor structure, which includes a substrate 100 (as shown in FIG. 3) including a cell region C.

The cell region C is used to form a memory cell of the SRAM memory, and the cell region C includes a first area I, a second area II and a third area III arranged along a first direction F.

The cell region C has a first fin 101, a second fin 102, a third fin 103 and a fourth fin 104. A surface of the substrate 100 between the first fin 101, the second fin 102, the third fin 103 and the fourth fins 104 has isolation layers 110. Each of the first fin 101, the second fin 102, the third fin 103 and the fourth fin 104 spans the first area I, the second area II and the third area III.

Figure 2:
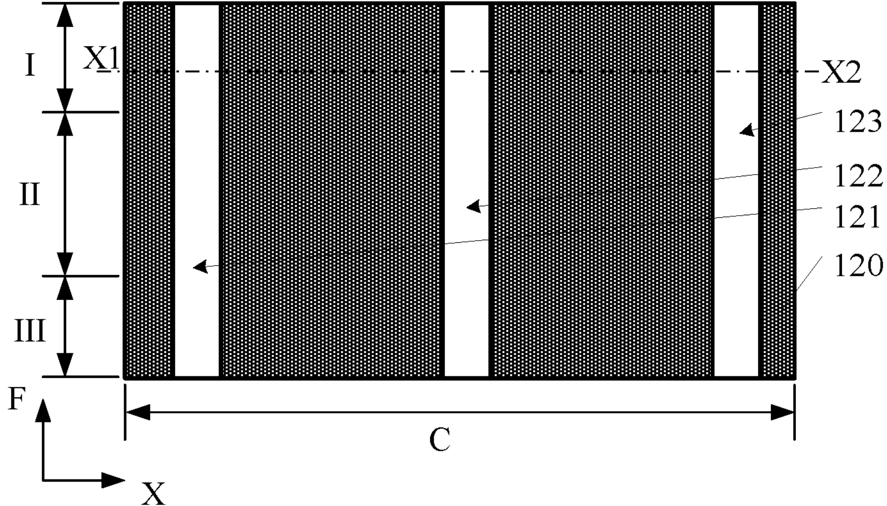

FIG. 2 illustrates a top structural view of FIG. 3, and FIG. 3 illustrates a cross-sectional structural view of FIG. 2 along a direction X1-X2. A first patterned layer 120 is formed on surfaces of the first fin 101, the second fin 102, the third fin 103 and the fourth fin 104.

An exemplary material of the first patterned layer 120 includes photoresist.

The first patterned layer 120 has a first opening 121, a second opening 122 and a third opening 123. Each of the first opening 121, the second opening 122 and the third opening 123 penetrates through the first area I, the second area II and the third area III. In addition, the first opening 121 and the third opening 123 expose the isolation layers 110 on opposite sides of the first fin 101 and the fourth fin

104 respectively. The second opening 122 exposes the isolation layer 110 between the second fin 102 and the third fin 103.

Figure 4:
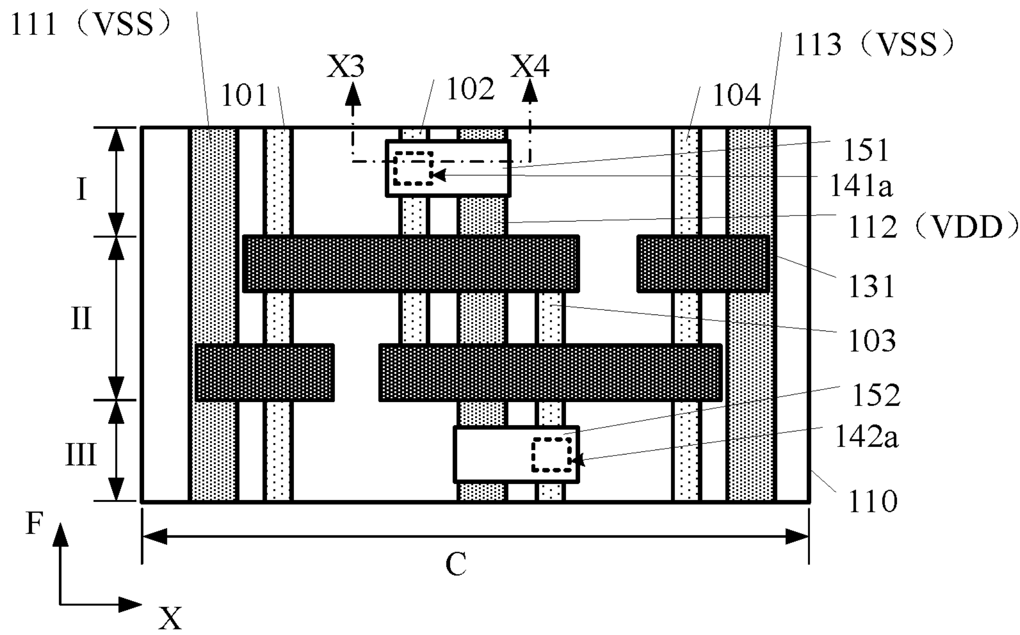
Figure 5:
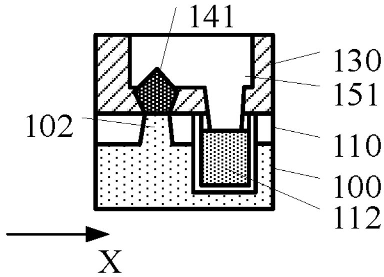

FIG. 4 illustrates a top structural view of FIG. 5, and FIG. 5 illustrates a cross-sectional structural view of FIG. 4 along a direction X3-X4. The isolation layers 110 and the substrate 100 are etched using the first patterned layer 120 (as shown in FIG. 2 and FIG. 3) as a mask, and a first power rail opening (not shown), a second power rail opening (not shown) and a third power rail opening (not shown) are formed in the isolation layers 110 and the substrate 100. A first buried power rail 111 is formed in the first power rail opening, and an isolation film (not shown) is arranged between the first buried power rail 111 and an inner wall of the first power rail opening. A second buried power rail 112 is formed in the second power rail opening, and an isolation film (not shown) is arranged between the second buried power rail 112 and an inner wall of the second power rail opening. A third buried power rail 113 is formed in the third power rail opening, and an isolation film (not shown) is arranged between the third buried power rail 113 and an inner wall surface of the third power rail opening.

The first buried power rail 111 and the third buried power rail 113 are both configured for connecting to a common ground terminal VSS, and the second buried power rail 112 is used for connecting a working voltage VDD.

By forming buried power rails (the first buried power rail 111, the second buried power rail 112, and the third buried power rail 113) for voltage distribution in the substrate 100 and isolation layers 110. On the one hand, substrate spaces between the fins are better utilized.

On the other hand, more areas are left above the cell region C to allow subsequent structures such as bit lines with larger line widths to be formed.

Referring to FIG. 4 and FIG. 5, after the first buried power rail 111, the second buried power rail 112 and the third buried power rail 113 are formed, the second fin 102 of the third area III and the third fin 103 of the first area I are removed.

Referring to FIG. 4 and FIG. 5, on the cell region C, an interlayer dielectric layer 130, a plurality of gate electrodes 131, a first source-drain structure 141 in the second fin 102 of the first area I, a second source-drain structure (not shown) in the third fin 103 of the third area III, a first conductive structure 151 in the interlayer dielectric layer 130 on the first area I, and a second conductive structure 152 in the interlayer dielectric layer 130 on the third area III are formed.

For ease of understanding, the interlayer dielectric layer 130 is not shown in FIG. 4, and FIG. 4 schematically illustrates a projection 141*a* of the first source-drain structure 141 on a surface of the substrate 100 and a projection 142*a* of the second source-drain structure 142 on a surface of the substrate 100.

The first conductive structure 151 is in contact with a top of the source-drain structure 141 and a surface of the second buried power rail 112. The second conductive structure 152 is in contact with a top of the source-drain structure 142 and a surface of the second buried power rail 112.

However, in the above method, since a pattern of the second power rail opening is defined by a pattern of the second opening 122, and the second opening 122 needs to be formed by precisely aligning a position between the second gate 132 and the third gate 133, therefore, a dimensional accuracy of the second opening 122 is required to be high, and an overlay accuracy of the pattern transmitted by the second opening 122 is required to be high. Therefore, a process window of a photolithography process for forming the first patterned layer 120 is small, and the photolithography process is difficult.

To solve the above technical problem, a technical solution of the present disclosure provides a semiconductor structure and its forming method, by forming sidewall spacers on sidewall surfaces of the first fin and the second fin after forming the first fin and the second fin, thereby improving performance of the semiconductor structure, and increasing the process window.

To make the above objects, features and beneficial effects of the present disclosure more clearly understood, a specific embodiment of the present disclosure is described below in detail with reference to the accompanying drawings.

FIGS. 6-21 illustrate cross-sectional structural views of each step in a method for forming a semiconductor structure according to one embodiment of the present disclosure. FIG. 22 illustrates an exemplary method for forming a semiconductor structure according to various disclosed embodiments of the present disclosure First, a substrate is formed. The substrate includes a power rail region, and the power rail region includes a first area and a second area arranged along a first direction. The power rail region has a first fin and a second fin arranged along a second direction, the first fin and the second fin span the second area, and the second direction is perpendicular to the first direction. For specific steps of forming the substrate, the first fin and the second fin, references can be made to FIGS. 6-10.

Figure 6:
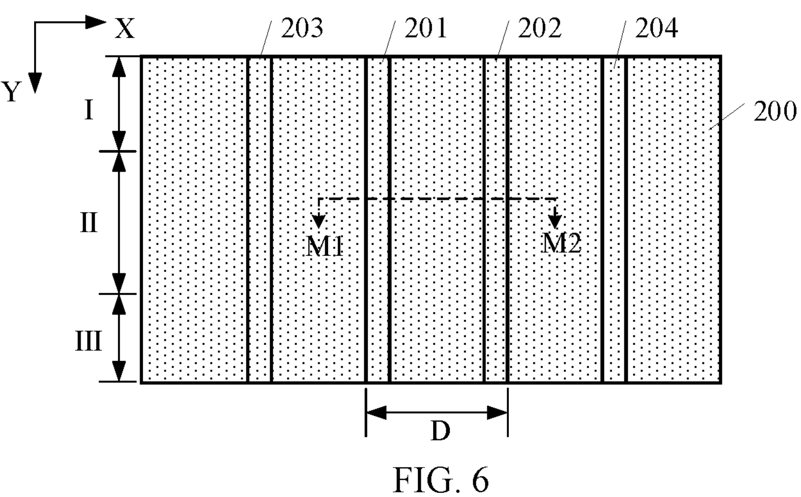
FIGS. 6-21 illustrate cross-sectional views of semiconductor structures corresponding to certain stages of forming an exemplary semiconductor structure according to one embodiment of the present disclosure.
Figure 7:
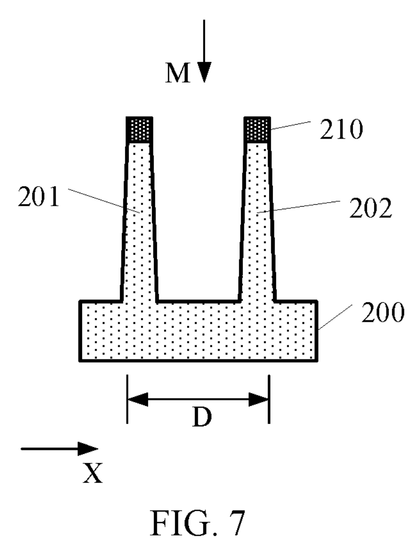
Figure 8:
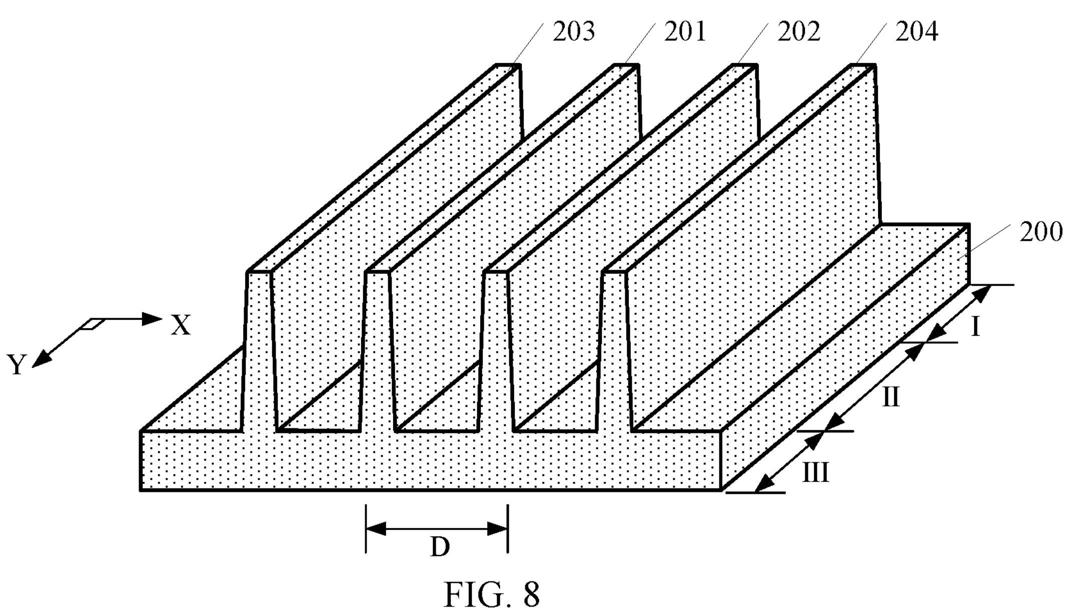

Referring to FIGS. 6-8, FIG. 6 illustrates a top structural view of FIG. 7 along a direction M, FIG. 7 illustrates a cross-sectional structural view of FIG. 6 along a direction M1-M2, and FIG. 8 illustrates a three-dimensional structural view of FIG. 8, which provides an initial substrate (not shown). The initial substrate is etched to form a substrate 200, an initial first fin 201 and an initial second fin 202 arranged along a second direction X on the substrate 200.

An exemplary material of the substrate 200 includes a semiconductor material.

In one embodiment, the material of the substrate 200 is silicon.

In other embodiments, the material of the substrate includes silicon carbide, silicon germanium, a multi-component semiconductor material composed of group III-V elements, silicon-on-insulator (SOI), or germanium-on-insulator. The multi-component semiconductor materials composed of group III-V elements include InP, GaAs, GaP, InAs, InSb, InGaAs or InGaAsP.

The substrate 200 includes a power rail region D configured to form buried power rails.

In one embodiment, the power rail region D includes a first area I, a second area II and a third area III arranged along a first direction Y. Through the first area I, the second area II and the third area III, differences in positions of the first fin and the second fin formed later in the first direction Y can be distinguished.

The first direction Y and the second direction X are perpendicular to each other.

Specifically, the subsequently formed first fin is on the first area I and the second area II, and the subsequently formed second fin are on the second area II and the third area III.

In other embodiments, the power rail region includes a first area and a second area arranged along the first direction. Both the first fin and the second fin are on the second area, and one of the first fin and the second fin is also on the first area.

The initial first fin 201 provide a material for a subsequent formation of the first fin, and the initial second fin 202 provide a material for a subsequent formation of the second fin.

In one embodiment, the initial first fin 201 and the initial second fin 202 span the first area I, the second area II and the third area III.

In one embodiment, the substrate 200 further includes a third fin 203 and a fourth fin 204. The third fin 203 and the fourth fin 204 are on the substrate 200 on two sides of the power rail region D respectively.

In one embodiment, the subsequently formed first fin and second fin, and the third fin 203 and the fourth fin 204 are used to form a SRAM cell.

In one embodiment, a method for etching the initial substrate includes: forming a first mask layer 210 on the initial substrate, and the first mask layer 210 exposing part of a surface of the initial substrate; etching the initial substrate using the first mask layer 210 as a mask until the substrate 200, the initial first fin 201, the initial second fin 202, the third fin 203 and the fourth fin 204 are formed.

It should be noted that, for ease of understanding, the first mask layer 210 is not shown in FIG. 6 and FIG. 8.

Figure 9:
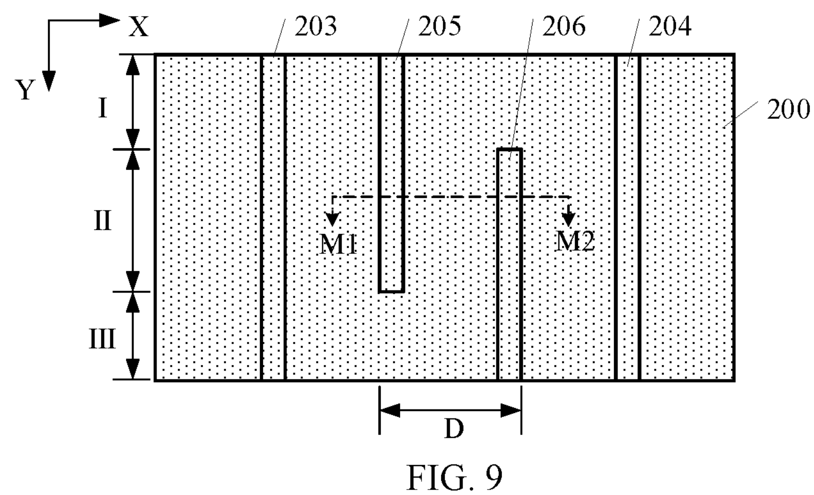
Figure 10:
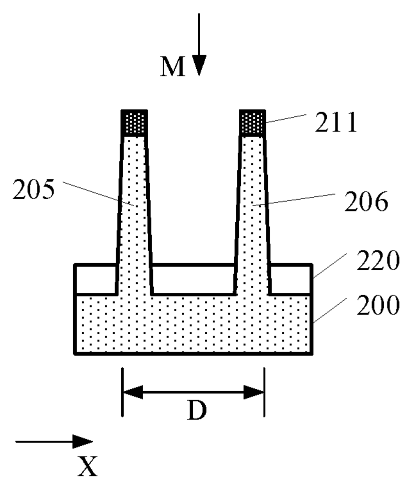

Referring to FIGS. 9 and 10, FIG. 9 illustrates a top structural view of FIG. 10 along the direction M, and FIG. 10 illustrates a cross-sectional structural view of FIG. 9 in the direction M1-M2. The initial first fin 201 of the third area III and the initial second fin 202 of the first area I are removed to form a first fin 205 and a second fin 206. The first fin 205 and the second fin 206 are arranged along the second direction X, and the first fin 205 and the second fin 206 span the second area II.

In one embodiment, the first fin 205 is on the first area I and the second area II, and the second fin 206 is on the second area II and the third area III.

By forming the first fin 205 on the first area I and the second area II, and the second fin 206 on the second area II and the third area III before a subsequent formation of the power rail openings, a larger reserve space for forming power rail openings in the first area I and the third area III is provided. Therefore, widths of the buried power rails subsequently formed in the power rail openings in the first area I and the third area III are increased.

In one embodiment, a method for removing the initial first fin 201 of the third area III and the initial second fin 202 of the first area I includes: forming a second mask layer (not shown) on the substrate 200, the initial first fin 201, the initial second fin 202, the third fin 203 and the fourth fin 204, the second mask layer exposing the first mask layer 210 on the initial first fin 201 of the region III and the first mask layer 210 on the initial second fin 202 of the first area I; and etching the mask layer 210, the initial first fin 201 and the initial second fin 202 using the second mask layer as a mask until the mask layer 210 of the first area I and the third area III, the initial first fin 201 of the third area III and the initial second fin 202 of the first area I are removed to form the first fin 205, the second fin 206, and the fin mask layer 211.

Specifically, the fin mask layer 211 is on top surfaces of the first fin 205, the second fin 206, the third fin 203 and the fourth fin 204.

Since the fin mask layer 211 is formed on top surfaces of the first fin 205 and the second fin 206, the top surfaces of the first fin 205 and the second fin 206 can be protected by the fin mask layer 211 in a subsequent etching process for forming the power rail openings, to reduce etching damages to the top surfaces of the first fin 205 and the second fin 206, thereby better improving performance and reliability of the semiconductor structure.

In other embodiments, a method for forming the first fin, the second fin, the third fin and the fourth fin includes: forming a patterned fin mask layer on the initial substrate; etching the initial substrate using the fin mask layer as a mask until the substrate, the first fin, the second fin, the third fin and the fourth fin are formed.

In one embodiment, an exemplary material of the fin mask layer 211 includes silicon nitride.

It should be noted that, for ease of understanding, the fin mask layer 211 is not shown in FIG. 9.

In one embodiment, after forming the first fin 205, the second fin 206, the third fin 203 and the fourth fin 204, and before a subsequent formation of the sidewall spacers, the first dielectric layer 220 is formed on the surface of the substrate 200. A surface of the first dielectric layer 220 is lower than the top surfaces of the first fin 205 and the second fin 206.

A material of the first dielectric layer 220 is different from the material of the fin mask layer 211. Therefore, in a subsequent etching process for forming the openings of the power rails, etching selectivity ratios for the first dielectric layer 220 and the fin mask layer 211 can be higher, so that a risk of the fin mask layer 211 being depleted to expose the top surfaces of the first fin 205 and the second fin 206 is lower, thereby further reducing a risk of damages to the top surfaces of the first fin 205 and the second fin 206.

The material of the first dielectric layer 220 is a dielectric material. The dielectric material includes at least one of silicon oxide, silicon nitride, silicon carbide, silicon oxycarbide, silicon oxynitride, aluminum oxide, aluminum nitride, silicon nitride carbide and silicon nitride/oxycarbide.

Preferably, the material of the first dielectric layer 220 includes silicon oxide.

Figure 11:
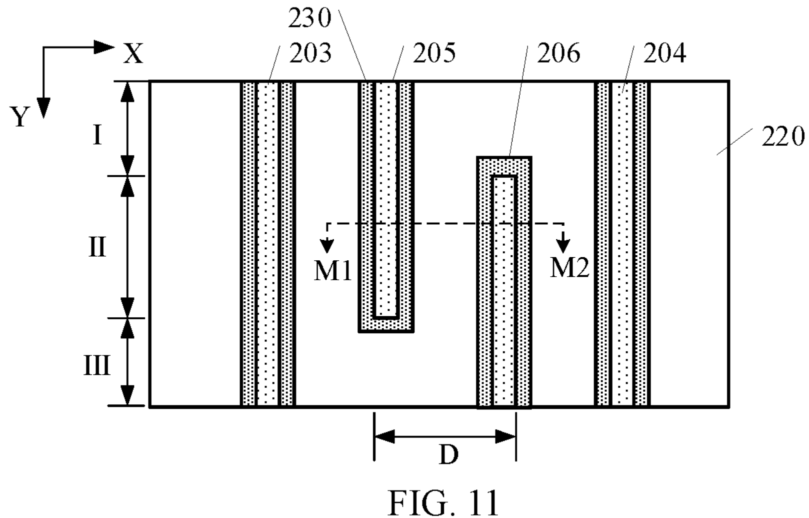
Figure 12:
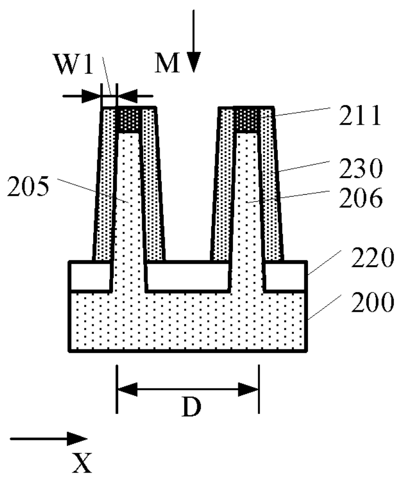

Referring to FIGS. 11 and 12, FIG. 11 illustrates a top structural view of FIG. 12 along the direction M, and FIG. 12 illustrates a cross-sectional structural view of FIG. 11 along the direction M1-M2. Sidewall spacers 230 are formed on sidewall surfaces of the first fin 205, the second fin 206, the third fin 203 and the fourth fin 204.

It should be noted that, for ease of understanding, the fin mask layer 211 is not shown in FIG. 11.

In one embodiment, a method for forming the sidewall spacers 230 includes:

depositing sidewall spacer material films (not shown) on surfaces of the first dielectric layer 220, the first fin 205, the second fin 206, the third fin 203, the fourth fin 204, and the fin mask layer 211; and etching the sidewall spacer material films using an anisotropic etching process in a direction perpendicular to the surface of the substrate 200 until a top surface of the fin mask layer 211 and the surface of the first dielectric layer 220 are exposed.

A process of depositing the sidewall spacer material films includes a chemical vapor deposition process, an atomic layer deposition process or the like.

Preferably, the sidewall spacer material films are formed by an atomic layer deposition process. A reason for using the atomic layer deposition process is that the atomic layer deposition process can form thin and dense sidewall spacer material films with a uniform film thickness, and at a same time, the atomic layer deposition process has a high process precision. Therefore, film thicknesses of the sidewall spacer material films can be better controlled, so that a thickness W1 of the formed sidewall spacers 230 can reach a design size. In addition, the thicknesses of the sidewall spacers 230 are uniform, dimensional accuracies are high, and at a same time, the dense sidewall spacers 230 can be formed. Therefore, dimensional accuracies and shapes of subsequently formed power rail openings can be further improved to form buried power rails with better reliability and performance.

In one embodiment, the anisotropic etching process includes a dry etching process. Specifically, the dry etching process includes a plasma etching process.

In one embodiment, the thickness W1 of the sidewall spacers 230 range from 3 nanometers to 10 nanometers.

If the thickness W1 is too small, in a subsequent etching process for forming the power rail openings, a risk of the sidewall spacers 230 being depleted to expose sidewall surfaces of the first fin 205 and the second fin 206 is high, resulting in a high risk of the buried power rails formed subsequently being in contact with the first fin 205 and the second fin 206, and a poor self-alignment effect of etching through the sidewall spacers 230. If the thickness W1 is too large, a width of the formed power rail openings becomes smaller, and the width of the buried power rails formed subsequently is small, which is not conducive to reducing a contact resistance, resulting in a poor performance improvement of the semiconductor structure. Therefore, selecting a suitable thickness W1, i.e., when the thickness W1 is between 3 nanometers and 10 nanometers, on the one hand, better realizes self-aligned etching, and on the other hand, improves better performance of the semiconductor structure.

In one embodiment, a material of the sidewall spacers 230 is same as the material of the fin mask layer 211, so that the sidewall spacers 230 and the fin mask layer 211 can be removed in a same step to simplify a forming process.

In one embodiment, the material of the sidewall spacers 230 includes silicon nitride.

Figures 13, 14, 15:
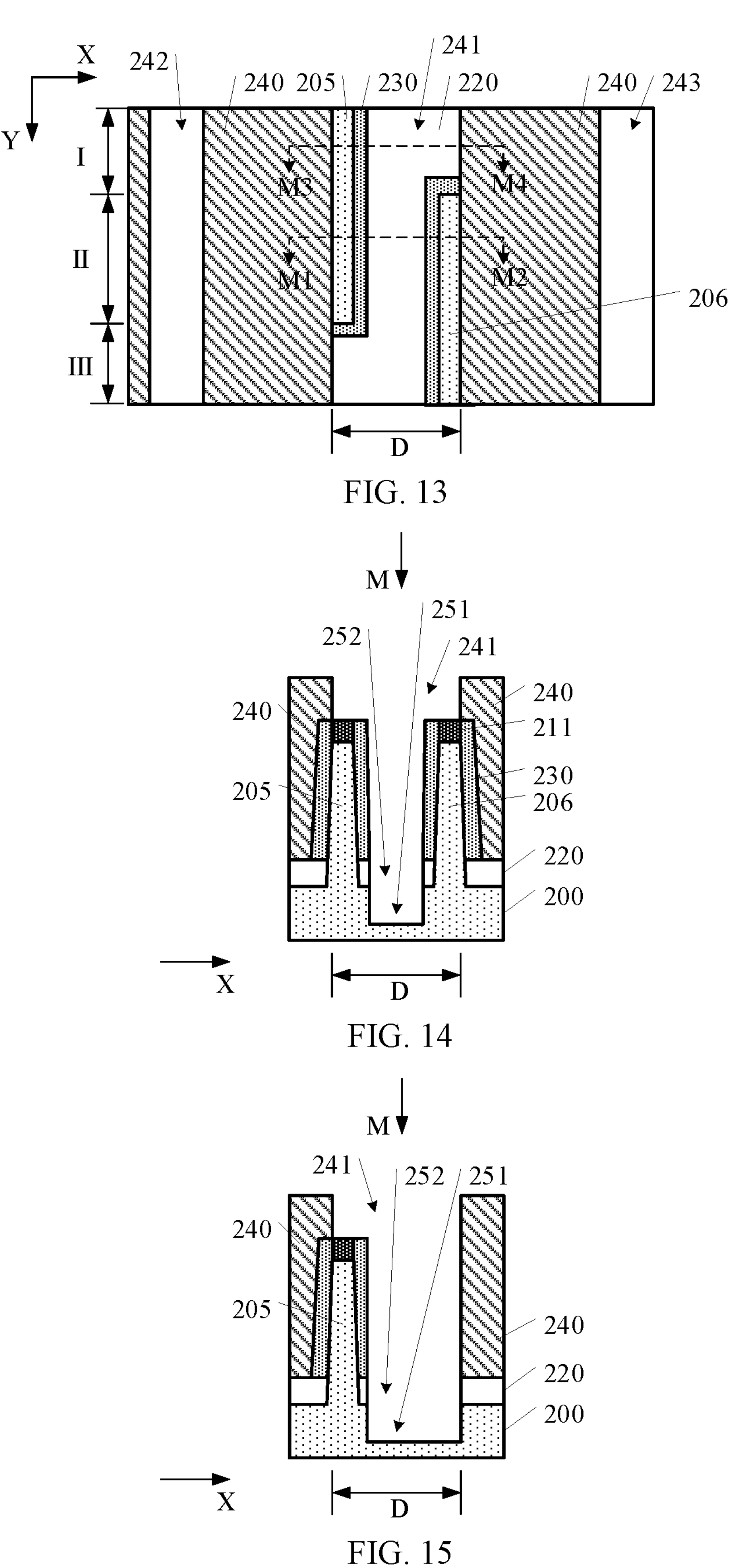

FIG. 13 illustrates a top structural view of FIGS. 14 and 15 along the direction M. FIG. 14 illustrates a cross-sectional structural view of FIG. 13 along the direction M1-M2, and FIG. 15 illustrates a cross-sectional structural view of FIG. 13 along a direction M3-M4. After the sidewall spacers 230 are formed, a first patterned layer 240 is formed on the substrate 200. A top surface of the first patterned layer 240 is higher than the top surfaces of the first fin 205 and the second fin 206. The first patterned layer 240 has a first opening 241 exposing the power rail region D.

It should be noted that, for ease of understanding, the fin mask layer 211 is not shown in FIG. 13.

In one embodiment, a process of forming the first patterned layer 240 includes an exposure process and a development process.

In one embodiment, a material of the first patterned layer 240 includes photoresist.

In one embodiment, the first patterned layer 240 further includes a second opening 242 and a third opening 243. Bottoms of the second opening 242 and the third opening 243 expose the surface of the first dielectric layer 220. The second opening 242, the first opening 241 and the third opening 243 are arranged along the second direction X. A projection of the third fin 203 (as shown in FIG. 11) on the surface of the substrate 200 is between a projection of the second opening 242 on the surface of the substrate 200 and a projection of the first opening 241 on the surface of the substrate 200. A projection of the fourth fin 204 (as shown in FIG. 11) on the surface of the substrate 200 is between the projection of the first opening 241 on the surface of the substrate 200 and a projection of the third opening 243 on the surface of the substrate 200.

The second opening 242 is configured to form the second buried power rail, and the third opening 243 is configured to form the third buried power rail.

Referring to FIGS. 13-15, the substrate 200 is etched using the first patterned layer 240 as a mask to form power rail openings 251 in the substrate 200.

The power rail openings 251 provide space for a subsequent formation of buried power rails.

In one embodiment, a process of etching the substrate 200 using the first patterned layer 240 as a mask includes at least one of a dry etching process and a wet etching process.

Preferably, the dry etching process is used to etch the substrate 200 by using the first patterned layer 240 as a mask. Specifically, the dry etching process includes an anisotropic plasma etching process.

In one embodiment, in the process of etching the substrate 200 using the first patterned layer 240 as a mask, the etching selection ratios of the substrate 200 and the sidewall spacers 230 are above 5:1. Therefore, a depletion of the sidewall spacers 230 is reduced through larger etching selectivity ratios, and shapes of the power rail openings 251 are better improved.

In one embodiment, the substrate 200 is etched by using the first patterned layer 240 as a mask. When a power rail opening 251 is formed in the substrate 200, a second power rail opening (not shown) is also formed in the substrate 200 under the second opening 242 and a third power rail opening (not shown) is formed in the substrate 200 under the third opening 242.

Specifically, the second power rail opening provides a space for forming the second buried power rail. The third power rail opening provides a space for forming the third buried power rail.

In one embodiment, before the substrate 200 is etched by using the first patterned layer 240 as a mask, the first dielectric layer 220 is also etched by using the first patterned layer 240 as a mask until the surface of the substrate 200 is exposed. A first extension opening 252 is formed in the first dielectric layer 220, and the first extension opening 252 is connected to the power rail opening 251.

In one embodiment, the first extension opening 252 provide a partial space for forming the buried power rail subsequently, that is, part of the buried power rail also extends into the first extension opening 252.

In other embodiments, the buried power rail is not in the first extension opening, and the first extension opening only provides a space for forming the second dielectric layer covering a top surface of the buried power rail.

In one embodiment, the first dielectric layer 220 is etched by using the first patterned layer 240 as a mask. When the first extension opening 252 is formed, a second extension opening (not shown) is also formed in the first dielectric layer 220 under the second opening 242, and a third extension opening (not shown) is formed in the first dielectric layer 220 under the third opening 243. The second extension opening is connected to the second power rail opening, and the third extension opening is connected to the third power rail opening.

In one embodiment, the second extension opening provides a partial space for forming the second buried power rail subsequently. That is, part of the second buried power rail also extends into the second extension opening. The third extension opening provides a partial space for forming the third buried power rail subsequently. That is, part of the third buried power rail also extends into the third extension opening.

In other embodiments, the second buried power rail is not in the second extension opening, and the second extension opening only provides a space for forming the second dielectric layer covering a top surface of the second buried power rail.

In other embodiments, the third buried power rail is not in the third extension opening, and the third extension opening only provides a space for forming the second dielectric layer covering a top surface of the third buried power rail.

Figure 16:
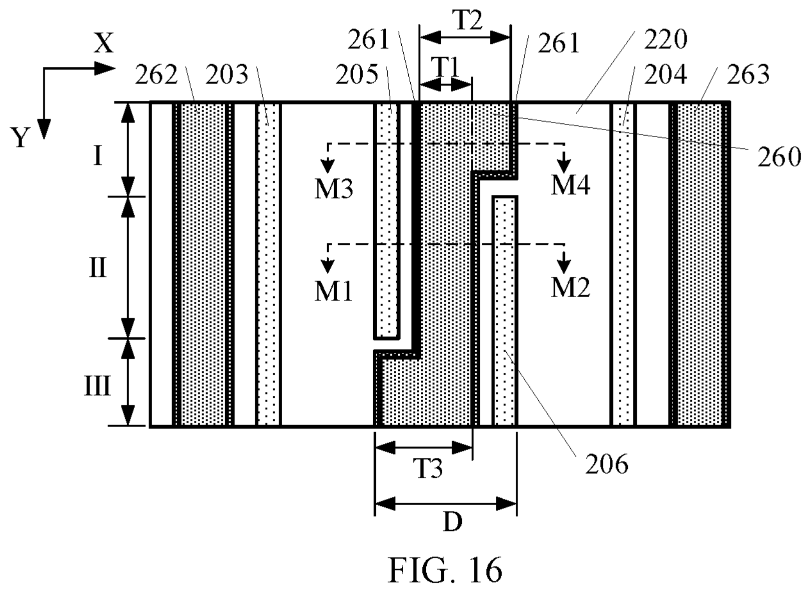
Figure 17:
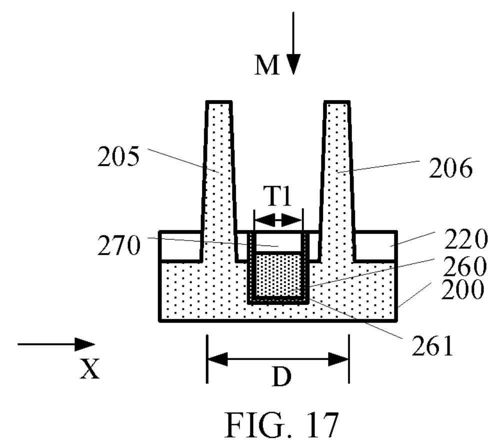
Figure 18:
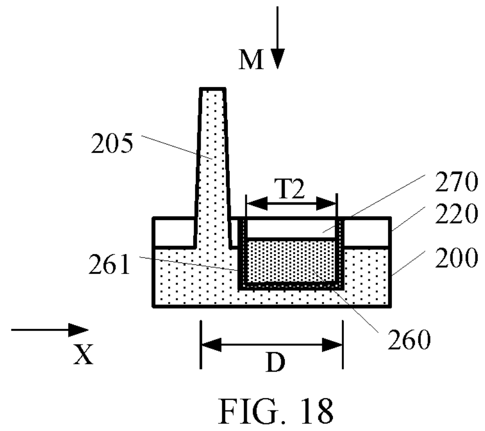

Referring to FIGS. 16-18, FIG. 16 illustrates a top structural view of FIG. 17 and FIG. 18 along the direction M, FIG. 17 illustrates a cross-sectional structural view of FIG. 16 along the direction M1-M2, and FIG. 18 illustrates a cross-sectional structural view of FIG. 16 along the direction M3-M4. An isolation film 261 is formed on an inner wall surface of the power rail opening 251.

A function of isolation films 261 is to electrically insulate the substrate 200 from sidewall surfaces and bottom surfaces of the buried power rails formed subsequently.

In one embodiment, an isolation film 261 is also formed on an inner wall surface of the first extension opening 252.

In one embodiment, the isolation films 261 are further formed on inner wall surfaces of the second power rail opening, the third power rail opening, the second extension opening and the third extension opening.

In one embodiment, a material of the isolation films 261 is a dielectric material. The dielectric material includes at least one of silicon oxide, silicon nitride, silicon carbide, silicon oxycarbide, silicon oxynitride, aluminum oxide, aluminum nitride, silicon nitride carbide, and silicon nitride/oxycarbide.

Specifically, In one embodiment, the material of the isolation films 261 includes silicon nitride.

In one embodiment, a process of forming the isolation films 261 includes a chemical vapor deposition process, an atomic layer deposition process or the like. Preferably, the isolation films 261 are formed by the atomic layer deposition process.

Referring to FIGS. 16-18, after an isolation film 261 is formed, a buried power rail 260 is formed in the power rail opening 251.

In the second direction X, a width T2 of the buried power rail 260 of the first area I is greater than a width T1 of the buried power rail 260 of the second area II.

Since the sidewall spacers are formed on the sidewall surfaces of the first fin 205 and the second fin 206 after the first fin 205 and the second fin 206 are formed, when the substrate is etched using the first patterned layer 240 as a mask, in a direction perpendicular to the sidewalls of the power rail openings 251, distances are formed between a sidewall of the power rail openings 251 and sidewalls of the first fin 205 and the second fin 206, thereby realizing a self-aligned etching. Therefore, not only can a pattern transfer of the buried power rail 260 be realized with a larger size of the first opening 241, but also the buried power rails 260 with different widths (width T2 and width T1) can be formed in the first area I and the second area II through a regular shape of the first opening 241 (rectangle), so that a width of the buried power rail 260 in the first area I is increased. When a process window of the first patterned layer 210 is increased, the buried power rail 260 with a lower parasitic resistance is formed, thereby improving performance of the semiconductor structure.

In addition, since the width of the buried power rail 260 of the first area I is increased, a larger first conductive structure can be formed subsequently. When the first conductive structure is formed, requirements for a position and a dimensional accuracy of the first conductive structure are reduced. Therefore, not only a process window for forming the first conductive structure is also increased, but also a contact resistance between the first conductive structure and the buried power rail 260 of the first area I is also reduced, so that performance of the semiconductor structure is further improved.

In one embodiment, in the second direction X, a width T3 of the buried power rail 260 of the third area III is also greater than the width T2 of the buried power rail 260 of the second area II.

A width of the buried power rail 260 of the third area III is also increased. Therefore, when a process window of the first patterned layer 210 is further enlarged, the buried power rail 260 with a smaller parasitic resistance is further formed, thereby improving performance of the semiconductor structure.

Since the width of the buried power rail 260 of the third area III is also increased, a second conductive structure with a larger size can be formed subsequently. When the second conductive structure is formed, requirements for a position and a dimensional accuracy of the second conductive structure are reduced. Therefore, not only a process window for forming the second conductive structure is also increased, but also a contact resistance between the second conductive structure and the buried power rail 260 of the third area III is also reduced, so that performance of the semiconductor structure is further improved.

In one embodiment, the buried power rail 260 is also formed in the first extension opening 252, and a surface of the buried power rail 260 is lower than a top surface of the first dielectric layer 220.

In other embodiments, the surface of the buried power rail is flush with the surface of the substrate.

In one embodiment, a process of forming the buried power rail 260 includes a metal plating process, a chemical vapor deposition process, or the like.

In one embodiment, a material of the buried power rail 260 includes at least one of rubidium, tungsten, and cobalt.

In one embodiment, after the buried power rail 260 is formed, a second dielectric layer 270 is formed in the first extension opening 252.

Specifically, a material of the second dielectric layer 270 includes silicon oxide.

Since the second dielectric layer 270 is formed before subsequent removals of the first patterned layer 240 and the sidewall spacers 230, the surface of the buried power rail 260 can be protected by the second dielectric layer 270 in a process of removing the first patterned layer 240 and the sidewall spacers 230, thereby reducing damages to the surface of the buried power rail 260 to better improve performance and reliability of the semiconductor structure.

It should be noted that, for ease of understanding, the second dielectric layer 270 is not shown in FIG. 16.

In one embodiment, after the second dielectric layer 270 is formed, the first patterned layer 240 is removed. After the first patterned layer 240 is removed, the sidewall spacers 230 and the fin mask layer 211 are removed.

In one embodiment, a process of removing the first patterned layer 240 includes an ashing process or the like.

In one embodiment, a process of removing the sidewall spacers 230 and the fin mask layer 211 includes at least one of a dry etching process and a wet etching process.

In one embodiment, while the buried power rail 260 is formed in the power rail opening 251 and part of the first extension opening 252, a second buried power rail 262 is formed in the second power rail opening and part of the second extension opening, a third buried power rail 263 is formed in the third power rail opening and part of the third extension opening, and the second dielectric layer 270 is also in the second extension opening and the third extension opening.

Figure 19:
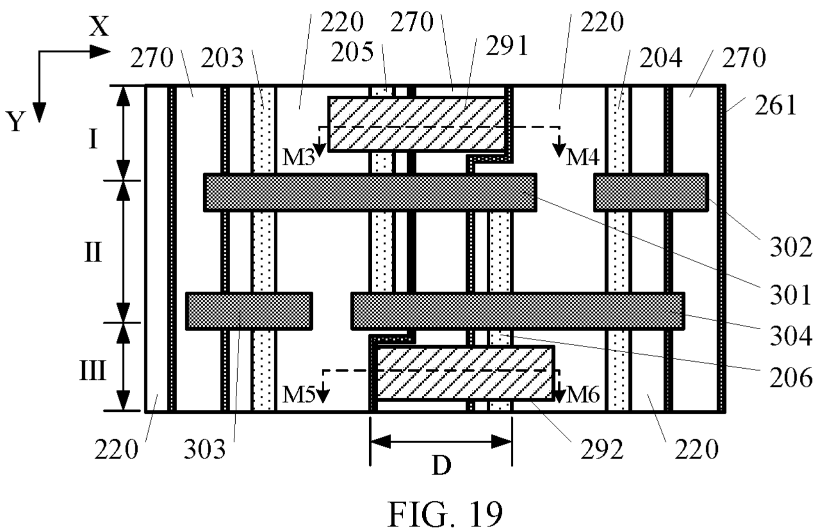
Figure 20:
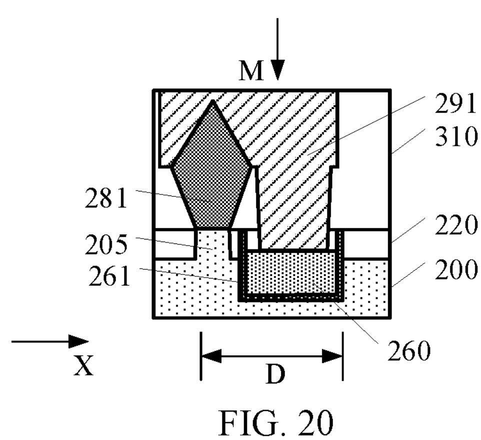
Figure 21:
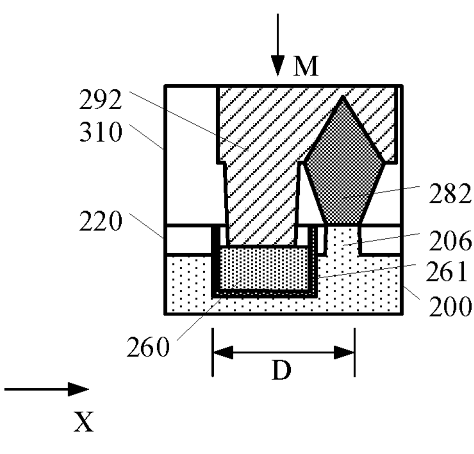

Referring to FIGS. 19 to 21, FIG. 19 illustrates a top structural view of FIG. 20 along the direction M, FIG. 20 illustrates a cross-sectional structural view of FIG. 19 along the direction M3-M4, and FIG. 21 illustrates a cross-sectional structural view of FIG. 19 along a direction M5-M6. After the sidewall spacers 230 are removed, a first source-drain opening (not shown) is formed in the first fin 205 on the first area I. A first source-drain structure 281 in the first source-drain opening is formed. After the sidewall spacers 230 are removed, a second source-drain opening (not shown) is formed in the second fin 206 of the third area III. A second source-drain structure 282 is formed in the second source-drain opening.

In one embodiment, a method for forming the semiconductor structure further includes forming a first gate 301, a second gate 302, a third gate 303, a fourth gate 304 and an interlayer dielectric layer 310 on a surface of the first dielectric layer 220 before forming the first conductive structure and the second conductive structure subsequently.

The first gate 301 spans the first fin 205 of the second area II, the second fin 206 of the second area II, and the third fin 203, the second gate 302 spans the fourth fin 204, the third gate 303 spans the third fin 203, and the fourth gate 304 spans the first fin 205 of the second area II, the second fin 206 of the second area II and the fourth fin 204.

The interlayer dielectric layer 310 is on surfaces of the first source-drain structure 281, the second source-drain structure 282 and the exposed first fin 205, the exposed second fin 206, the exposed third fin 203 and the exposed fourth fin 204. The interlayer dielectric layer 310 is also on surfaces of the first gate 301, the second gate 302, the third gate 303 and the fourth gate 304. A surface of the interlayer dielectric layer 310 is higher than top surfaces of the first gate 301, the second gate 302, the third gate 303 and the fourth gate 304.

An exemplary material of the interlayer dielectric layer 310 is a dielectric material. The dielectric material includes at least one of silicon oxide, silicon nitride, silicon carbide, silicon oxycarbide, silicon oxynitride, aluminum oxide, aluminum nitride, silicon nitride carbide, and silicon nitride/oxycarbide.

Preferably, the material of the interlayer dielectric layer 310 includes silicon oxide.

It should be noted that, for ease of understanding, the interlayer dielectric layer 310 is not shown in FIG. 19.

Referring to FIGS. 19-21, after the first source-drain structure 281 and the second source-drain structure 282 are formed, a first conductive structure 291 is formed on the first area I, and a second conductive structure 292 is formed on the second area II. The first conductive structure 291 is in contact with a top surface of the first source-drain structure 281 and a top surface of the buried power rail 260 of the first area I. The second conductive structure 292 is in contact with a top surface of the second source-drain structure 282 and a top surface of the buried power rail 260 of the third area III.

In one embodiment, a method for forming the first conductive structure 291 and the second conductive structure 292 includes: forming a conductive structure mask layer (not shown) on a surface of the interlayer dielectric layer 310, the conductive structure mask layer exposing part of the surface of the interlayer dielectric layer 310 of the first area I and the third area III; etching the exposed interlayer dielectric layer 310 and the second dielectric layer 270 using the conductive structure mask layer as a mask until the top surface of the first source-drain structure 281 and the top surface of the second source-drain structure 282 are exposed, the top surface of the buried power rail 260 of the first area I, and the top surface of the buried power rail 260 of the third area III to form a first conductive opening (not shown) and a second conductive opening (not shown), the bottom of the first conductive opening exposing the top surface of the first source-drain structure 281 and the top surface of the buried power rail 260 in the first area I, and the bottom of the second conductive opening exposing the top surface of the second source-drain structure 282 and the top surface of the buried power rail 260 of the third zone III; forming a conductive material layer (not shown) in the first conductive opening, in the second conductive opening, and on the surface of the interlayer dielectric layer 310, a surface of the conductive material layer being higher than the surface of the interlayer dielectric layer 310; and planarizing the conductive material layer until the surface of the interlayer dielectric layer 310 is exposed, forming the first conductive structure 291 in the first conductive opening, and forming the second conductive structure 292 in the second conductive opening.

Accordingly, one embodiment of the present disclosure further provides a semiconductor structure formed by the above method. Referring to FIGS. 19-21, the semiconductor structure includes: a substrate 200 including a power rail region D including a first area I and a second area II arranged along a first direction Y, the power rail region D having a first fin 205 and a second fin 206 arranged along a second direction X, the first fin 205 and the second fin 206 spanning the second area II, the second fin 205 and the second fin 206, and the direction X being perpendicular to the first direction Y; buried power rails 260 in the power rail region D, a buried power rail 260 of the second area II being in the substrate 200 between the first fin 205 and the second fin 206, and a width T2 of the buried power rail 260 in the first area I (as shown in FIG. 16) being greater than a width T1 of the buried power rail 260 in the second area II (as shown in FIG. 16) in the second direction X; and isolation films 261 between the buried power rails 260 and the substrate 200.

An exemplary material of the substrate 200 is a semiconductor material.

In one embodiment, the material of the substrate 200 is silicon.

In other embodiments, the material of the substrate includes silicon carbide, silicon germanium, a multi-component semiconductor material composed of group III-V elements, silicon-on-insulator (SOI), or germanium-on-insulator. The multiple-component semiconductor materials composed of III-V group elements include InP, GaAs, GaP, InAs, InSb, InGaAs or InGaAsP.

In one embodiment, the power rail region D further includes a third area III, and the first area I, the second area II and the third area III arranged along the first direction Y.

Specifically, the first fin 205 is on the first area I and the second area II, and the second fin 206 is on the second area II and the third area III.

In one embodiment, in the second direction X, a width T3 of the buried power rail 260 of the third area III is also greater than the width T2 of the buried power rail 260 of the second area II.

In other embodiments, the power rail region includes a first area and a second area arranged along the first direction.

Both the first fin and the second fin are on the second area, and one of the first fin and the second fin is also on the first area.

In one embodiment, a material of the buried power rails 260 includes at least one of rubidium, tungsten, and cobalt.

In one embodiment, a material of the isolation films 261 is a dielectric material. The dielectric material includes at least one of silicon oxide, silicon nitride, silicon carbide, silicon oxycarbide, silicon oxynitride, aluminum oxide, aluminum nitride, silicon nitride carbide, and silicon nitride/oxycarbide.

Specifically, In one embodiment, the material of the isolation films 261 includes silicon nitride.

In one embodiment, the substrate 200 further includes a third fin 203 and a fourth fin 204. The third fin 203 and the fourth fin 204 are on the substrate 200 on two sides of the power rail region D respectively.

In one embodiment, the semiconductor structure further includes: a first dielectric layer 220 on a surface of the substrate 200, and on sidewalls of the first fin 205, the second fin 206, the third fin 203 and the fourth fin 204. A surface of the first dielectric layer 220 is lower than top surfaces of the first fin 205, the second fin 206, the third fin 203 and the fourth fin 204.

An exemplary material of the first dielectric layer 220 is a dielectric material. The dielectric material includes silicon oxide, silicon nitride, silicon carbide, silicon oxycarbide, silicon oxynitride, aluminum oxide, aluminum nitride, silicon nitride carbide and nitrogen At least one of silicon nitride/oxycarbide.

Preferably, the material of the first dielectric layer 220 includes silicon oxide.

In one embodiment, the buried power rails 260 also extend upward into the first dielectric layer 220. The isolation films 261 are also between sidewalls of the buried power rails 260 and the first dielectric layer 220. Surfaces of the buried power rails 260 are lower than a top surface of the first dielectric layer 220.

In other embodiments, the surfaces of the buried power rails are flush with the surface of the substrate.

In one embodiment, the semiconductor structure further includes: a second dielectric layer 270 on top surfaces of the buried power rails 260, and in the first dielectric layer 220.

In one embodiment, the material of the second dielectric layer 270 includes silicon oxide.

In one embodiment, the semiconductor structure further includes: a first source-drain opening (not shown) in the first fin 205 on the first area I; a first source-drain structure 281 in the first source-drain opening; and a first conductive structure 291 on the first area I, the first conductive structure 291 being in contact with a top surface of the first source-drain structure 281 and a top surface of the buried power rail 260 of the first area I.

In one embodiment, the semiconductor structure further includes: a second source-drain opening (not shown) in the second fin 206 on the third area III; a second source-drain structure 282 in the second source-drain opening; and a second conductive structure 292 on the third area III, the second conductive structure 292 being in contact with a top surface of the second source-drain structure 282 and a top surface of the buried power rail 260 in the third area III.

In one embodiment, the semiconductor structure further includes: a first gate 301, a second gate 302, a third gate 303, a fourth gate 304 and an interlayer dielectric layer 310 on the surface of the first dielectric layer 220.

The first gate 301 spans the first fin 205 of the second area II, the second fin 206 of the second area II, and the third fin 203, the second gate 302 spans the fourth fin 204, the third gate 303 spans the third fin 203, and the fourth gate 304 spans the first fin 205 of the second area II, the second fin 206 of the second area II and the fourth fin 204.

The interlayer dielectric layer 310 is on surfaces of the first source-drain structure 281, the second source-drain structure 282 and the exposed first fin 205, the exposed second fin 206, the exposed third fin 203 and the exposed fourth fin 204. The interlayer dielectric layer 310 is also on surfaces of the first gate 301, the second gate 302, the third gate 303 and the fourth gate 304. A surface of the interlayer dielectric layer 310 is higher than top surfaces of the first gate 301, the second gate 302, the third gate 303 and the fourth gate 304.

In one embodiment, the interlayer dielectric layer 310 is also on sidewalls of the first conductive structure 291 and the second conductive structure 292. The interlayer dielectric layer 310 exposes top surfaces of the first conductive structure 291 and the second conductive structure 292.

An exemplary material of the interlayer dielectric layer 310 is a dielectric material. The dielectric material includes at least one of silicon oxide, silicon nitride, silicon carbide, silicon oxycarbide, silicon oxynitride, aluminum oxide, aluminum nitride, silicon nitride carbide, and silicon nitride/oxycarbide.

Preferably, the material of the interlayer dielectric layer 310 includes silicon oxide.

In one embodiment, the semiconductor structure further includes a second buried power rail 262 and a third buried power rail 263 in the substrate 200.

Specifically, the second buried power rail 262, the buried power rail 260 and the third buried power rail 263 are arranged along the second direction X. A projection of the third fin 203 on the surface of the substrate 200 is between a projection of the second buried power rail 262 on the surface of the substrate 200 and a projection of the buried power rail 260 on the surface of the substrate 200. A projection of the fourth fin 204 on the surface of the substrate 200 is between a projection of the buried power rail 260 on the surface of the substrate 200 and a projection of the third buried power rail 263 on the surface of the substrate 200.

In one embodiment, the second buried power rail 262 and the third buried power rail 263 are both configured for connecting to a common ground terminal VSS, and the buried power rail 263 is configured for connecting a working voltage VDD.

In one embodiment, the second dielectric layer 270 is also on top surfaces of the second buried power rail 262 and the third buried power rail 263.

Compared with the existing semiconductor structure, the technical solution of the present disclosure has the following advantages.

In the method for forming a semiconductor structure provided by the technical solution of the present disclosure, after the first fin and the second fin are formed, the sidewall spacers are formed on the sidewall surfaces of the first fin and the second fin. Therefore, when the substrate is etched by using the first patterned layer as a mask, the sidewalls of the formed power rail openings and the sidewalls of the first fin and the second fin can be spaced apart, thereby realizing a self-alignment etching. Therefore, not only can a pattern transfer of the buried power rails be realized with a larger size of the first opening, but also buried power rails with different widths can be formed in the first area and the second area, so that the width of the power rail of the first area is increased through a regular shape of the first opening (rectangle). Therefore, a process window of the first patterned layer is increased, at a same time, buried power rails with lower parasitic resistances are formed, thereby improving performance of the semiconductor structure.

Although the present disclosure is described as above, the present disclosure is not limited thereto. A person skilled in the art can make various changes and modifications without departing from the spirit and scope of the present disclosure. The protection scope of the present disclosure should be subject to the scope defined by the claims.

What is claimed is:

1. A semiconductor structure, comprising:
- a substrate including a power rail region, the power rail region including a first area, a second area, and a third area arranged along a first direction;
- a first fin on the first and second areas and extending lengthwise along the first direction, and a second fin on the second and third areas and extending lengthwise along the first direction, the first and second fins being arranged widthwise along a second direction, and the second direction being perpendicular to the first direction;
- a buried power rail having a length spanning the first, second and third areas along the first direction in the power rail region, the buried power rail being formed in the substrate, the buried power rail in the second area being between the first fin and the second fin, and in the second direction widths of the buried power rail in the first area and the third area being greater than a width of the buried power rail in the second area; and
- an isolation film formed between the buried power rail and the substrate, wherein
- orthographic projections, to a plane perpendicular to the first direction, of the first fin and a portion of the buried power rail in the third area, overlap with each other; and
- orthographic projections, to the plane perpendicular to the first direction, of the second fin and a portion of the buried power rail in the first area, overlap with each other.

2. The structure according to claim 1, further comprising a first dielectric layer on a top surface of the substrate, wherein:
- a top surface of the first dielectric layer is lower than top surfaces of the first and second fins along a third direction, the buried power rail also extends upward along the third direction into the first dielectric layer, the isolation film is also between sidewalls of the buried power rail and the first dielectric layer, and a top surface of the buried power rail is lower than the top surface of the first dielectric layer along the third direction, the third direction being perpendicular to both the first direction and the second direction.

3. The structure according to claim 2, further comprising a second dielectric layer on the top surface of the buried power rail and in the first dielectric layer.

4. The structure according to claim 1, further comprising:
- a first source-drain opening in the first fin on the first area;
- a first source-drain structure in the first source-drain opening; and
- a first conductive structure on the first area, the first conductive structure being in contact with a top surface of the first source-drain structure and a top surface of the buried power rail in the first area.

5. The structure according to claim 1, further comprising:
- a second source-drain opening in the second fin on the third area;
- a second source-drain structure in the second source-drain opening; and
- a second conductive structure on the third area, the second conductive structure being in contact with a top surface of the second source-drain structure and a top surface of the buried power rail in the third area.

6. The structure according to claim 3, wherein a top surface of the second dielectric layer is flush with the top surface of the first dielectric layer along the third direction.

7. The structure according to claim 2, further comprising an interlayer dielectric layer on a surface of the first dielectric layer.

8. The structure according to claim 4, further comprising an interlayer dielectric layer on the first source-drain structure.

9. The structure according to claim 5, further comprising an interlayer dielectric layer on the second source-drain structure.

10. The structure according to claim 1, wherein the substrate is made of silicon, silicon carbide, silicon germanium, a multi-component semiconductor material composed of group III-V elements, silicon-on-insulator (SOI), or germanium-on-insulator.

11. The structure according to claim 1, wherein the buried power rail is made of rubidium, tungsten, or cobalt.

12. The structure according to claim 1, wherein the isolation film is made of silicon oxide, silicon nitride, silicon carbide, silicon oxycarbide, silicon oxynitride, aluminum oxide, aluminum nitride, silicon nitride carbide, or silicon nitride/oxycarbide.

13. The structure according to claim 1, wherein the substrate further includes a third fin and a fourth fin on two sides of the power rail region respectively along the second direction.

14. The structure according to claim 2, wherein the first dielectric layer is on sidewalls of the first fin and the second fin.

15. The structure according to claim 2, wherein the first dielectric layer is made of silicon oxide, silicon nitride, silicon carbide, silicon oxycarbide, silicon oxynitride, aluminum oxide, or aluminum nitride.

16. The structure according to claim 3, wherein the second dielectric layer is made of silicon oxide.

17. The structure according to claim 7, wherein the interlayer dielectric layer is made of silicon oxide, silicon nitride, silicon carbide, silicon oxycarbide, silicon oxynitride, aluminum oxide, aluminum nitride, silicon nitride carbide, or silicon nitride/oxycarbide.

18. The structure according to claim 1, further comprising a first gate, a second gate, a third gate, and a fourth gate, wherein:
- the first gate spans along the second direction the first fin of the second area, and the second fin of the second area;
- the first gate is separate from the second gate along the second direction;
- the fourth gate spans along the second direction the first fin of the second area and the second fin of the second area; and
- the fourth gate is separate from the third gate along the second direction.

19. The structure according to claim 18, wherein:

the substrate further includes a third fin and a fourth fin on two sides of the power rail region respectively along the second direction;

the first gate is separate from the second gate along the second direction between the second fin and the fourth fin; and the fourth gate is separate from the third gate along the second direction between the first fin and the third fin.

* * * * *